US007989777B2

(12) United States Patent
Goshima (10) Patent No.: US 7,989,777 B2
(45) Date of Patent: Aug. 2, 2011

(54) METHOD FOR INSPECTING SETTLING TIME OF DEFLECTION AMPLIFIER, AND METHOD FOR JUDGING FAILURE OF DEFLECTION AMPLIFIER

(75) Inventor: Yoshikuni Goshima, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 251 days.

(21) Appl. No.: 12/432,874

(22) Filed: Apr. 30, 2009

(65) Prior Publication Data

US 2009/0272911 A1 Nov. 5, 2009

(30) Foreign Application Priority Data

May 1, 2008 (JP) ................................. 2008-119557

(51) Int. Cl.
*G21K 1/087* (2006.01)
(52) U.S. Cl. ............. 250/396 R; 250/396 ML; 250/397; 250/398; 250/492.22; 250/491.1; 341/120; 341/141
(58) Field of Classification Search ............... 250/396 R, 250/396 ML, 397, 398, 492.22, 491.1; 341/120, 341/144
See application file for complete search history.

(56) References Cited

U.S. PATENT DOCUMENTS

| | | | | |
|---|---|---|---|---|
| 3,984,827 A * | 10/1976 | Hickin et al. | | 345/16 |
| 4,954,757 A * | 9/1990 | Berwin | | 315/403 |
| 5,345,085 A * | 9/1994 | Prior | | 250/491.1 |
| 5,404,018 A * | 4/1995 | Yasuda et al. | | 250/492.22 |
| 5,530,250 A * | 6/1996 | Yamashita | | 250/396 R |
| 5,719,402 A * | 2/1998 | Satoh et al. | | 250/396 R |
| 5,721,432 A * | 2/1998 | Satoh et al. | | 250/398 |
| 7,068,202 B2 * | 6/2006 | Waltari | | 341/155 |
| 7,088,275 B2 * | 8/2006 | Waltari | | 341/155 |
| 7,417,233 B2 * | 8/2008 | Stovall et al. | | 250/396 R |
| 7,463,173 B2 * | 12/2008 | Sanmiya et al. | | 341/120 |
| 7,589,335 B2 * | 9/2009 | Matsukawa et al. | | 250/492.22 |
| 7,601,968 B2 * | 10/2009 | Abe et al. | | 250/396 R |
| 7,741,614 B2 * | 6/2010 | Inoue | | 250/400 |
| 7,834,333 B2 * | 11/2010 | Nishimura et al. | | 250/492.22 |
| 7,898,447 B2 * | 3/2011 | Goshima et al. | | 341/120 |
| 2009/0032738 A1 * | 2/2009 | Takekoshi | | 250/492.22 |

(Continued)

FOREIGN PATENT DOCUMENTS

| | | |
|---|---|---|
| JP | 10-027749 | 1/1998 |
| JP | 2004-259812 | 9/2004 |
| JP | 2006-339405 | 12/2006 |

OTHER PUBLICATIONS

Office Action issued Feb. 14. 2011, in Korean Patent Application No. 10-2009-37900, (w/English translation), pp. 1-7.

*Primary Examiner* — David A Vanore
(74) *Attorney, Agent, or Firm* — Oblon, Spivak, McClelland, Maier & Neustadt, L.L.P.

(57) ABSTRACT

A method for inspecting a settling time of a deflection amplifier includes setting a settling time, performing shooting a plurality of times alternately to project two patterns of different types which are shaped by making a charged particle beam pass through a first and a second apertures while deflecting the charged particle beam by a deflector controlled by an output of a deflection amplifier which is driven based on the settling time having been set, measuring beam currents of the shooting, calculating an integral current of the beam currents measured, and calculating a difference between the integral current calculated and a reference integral current to output the difference.

10 Claims, 10 Drawing Sheets

U.S. PATENT DOCUMENTS

2009/0084990 A1* 4/2009 Nishimura et al. ...... 250/492.22
2009/0134343 A1* 5/2009 Inoue ....................... 250/492.22
2010/0207017 A1* 8/2010 Horiuchi et al. ........... 250/252.1
2010/0288939 A1* 11/2010 Nishimura .................... 250/397

* cited by examiner

Related Art

FIG. 13

METHOD FOR INSPECTING SETTLING TIME OF DEFLECTION AMPLIFIER, AND METHOD FOR JUDGING FAILURE OF DEFLECTION AMPLIFIER

CROSS-REFERENCE TO RELATED APPLICATION

This application is based upon and claims the benefit of priority from the prior Japanese Patent Application No. 2008-119557 filed on May 1, 2008 in Japan, the entire contents of which are incorporated herein by reference.

BACKGROUND OF THE INVENTION

1. Field of the Invention

The present invention relates to a method for inspecting a settling time of a deflection amplifier, and a method for judging a failure of a deflection amplifier. For example, it relates to a method for inspecting a settling time of a shaping amplifier for deflecting electron beams, which is installed in an electron beam writing apparatus that deflects variable-shaped electron beams to irradiate a target workpiece, and to a method for detecting a failure of a shaping amplifier.

2. Description of Related Art

The microlithography technique which advances microminiaturization of semiconductor devices is extremely important as being the only process of forming patterns in semiconductor manufacturing processes. In recent years, with high integration of large-scale integrated circuits (LSI), critical dimensions required for semiconductor device circuits are shrinking year by year. In order to form a desired circuit pattern on such semiconductor devices, a master or "original" pattern (also called a mask or a reticle) of high precision is required. Then, the electron beam writing technique intrinsically having excellent resolution is used for producing such highly precise master patterns.

Figure 13:
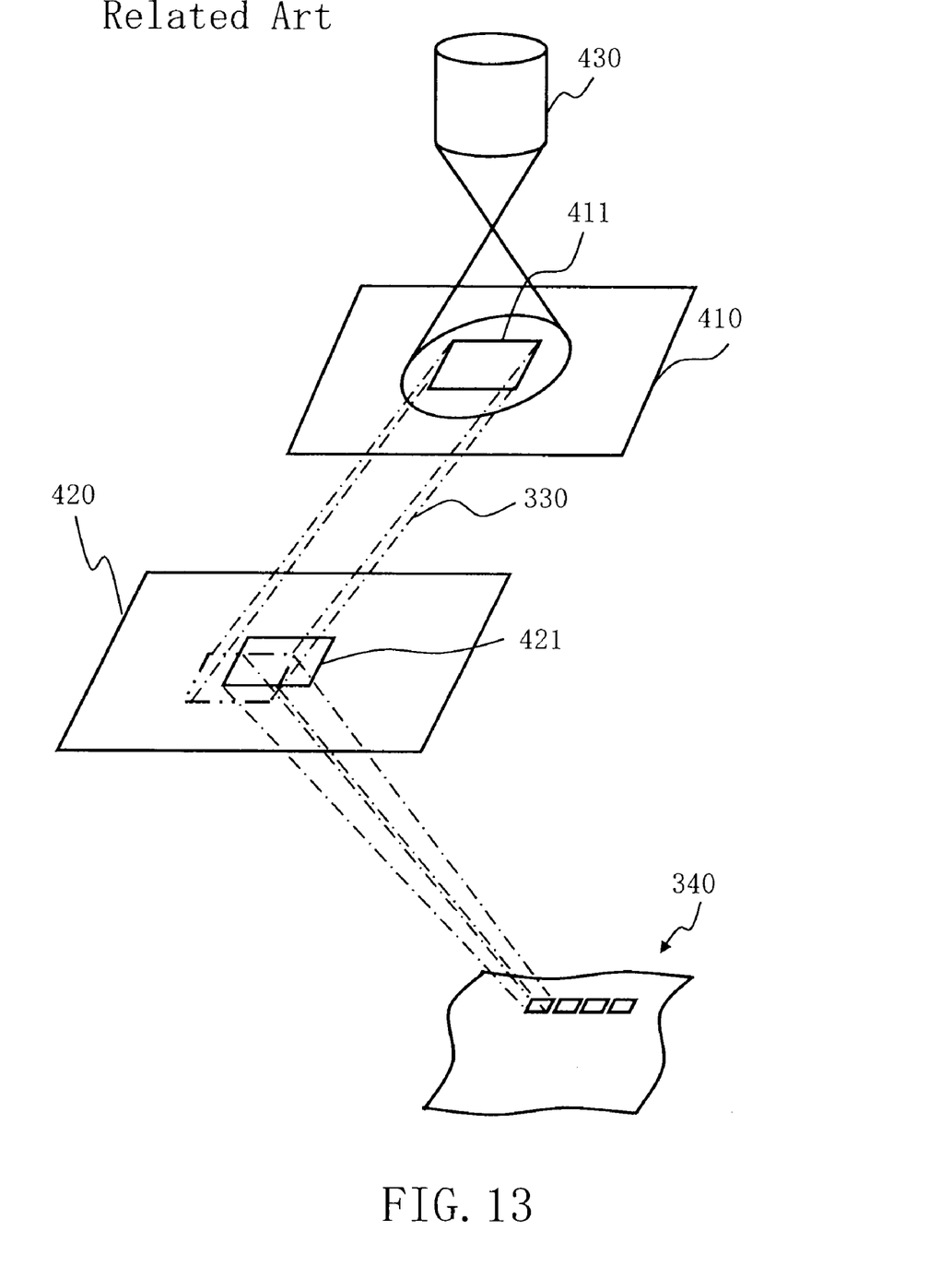
FIG. 13 is a schematic diagram showing operations of a variable-shaped electron beam type writing apparatus.

FIG. 13 is a schematic diagram showing operations of a conventional variable-shaped electron beam (EB) type writing apparatus. As shown in the figure, the variable-shaped electron beam writing apparatus, including two aperture plates, operates as follows: A first aperture plate 410 has a quadrangular such as rectangular opening or "hole" 411 for shaping an electron beam 330. A second aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which continuously moves in one predetermined direction (e.g. X direction) during the writing or "drawing." In other words, a rectangular shaped as a result of passing through both the opening 411 and the variable-shaped opening 421 is written in the writing region of the target workpiece 340 on the stage. This method of forming a given shape by letting beams pass through both the opening 411 and the variable-shaped opening 421 is referred to as a "variable shaped" method.

In the pattern writing apparatus, as mentioned above, a pattern is projected onto a target workpiece by a deflection of a charged particle beam, such as an electron beam. A deflection amplifier is used for such a beam deflection. As functions of the beam deflection using the deflection amplifier, controlling the shape or size of an electron beam being shot, controlling a shot position, and blanking the beam can be exemplified.

In recent years, a throughput requested for the electron beam pattern writing apparatus is very high. Then, it is also requested to shorten a preparation time (settling time) with respect to a shot position or a beam shaping. Although the settling time can be set arbitrarily, if it is set long, the throughput is lowered by that much. Conversely, if the settling time is too short, since sufficient voltage is not applied to a deflector, necessary deflection is not performed. Consequently, an error may occur with respect to a pattern dimension or a shot position. Therefore, finding the optimal settling time is needed. Conventionally, in order to find the optimal settling time, writing onto a substrate on which resist is applied, developing the written substrate, and measuring the dimension of a pattern formed by etching are actually performed. Then, repeatedly performing these operations while changing the settling time, a settling time based on which a highly precise pattern dimension has been shaped is regarded as the optimal settling time. These operations need about ten hours conventionally, and thereby reducing the time for operations is requested.

Moreover, when an error occurs with respect to a pattern dimension or a shot position, identifying the cause of the error becomes necessary. If it is possible to quickly judge whether the cause is a failure of a shaping amplifier or not, the downtime period of the apparatus can be shortened. Therefore, a method for quickly judging a failure of a shaping amplifier is requested. Then, as a cause of a failure of the shaping amplifier, degradation of the settling performance occupies much of the cause. Therefore, a method for quickly judging whether the settling performance has deteriorated or not is requested. However, a sufficient judgment method has not been conventionally established.

Although not related to a defect of the shaping amplifier, a technique is disclosed that inputs deflection data into one of two shaping amplifiers and time differentially inputs another deflection data, having a direction reverse to the former one, into the other shaping amplifier at a certain cycle before and after writing, and measures a voltage change at the middle point of a measurement resistance between respective outputs by using an oscilloscope in order to detect the settling time of the shaping amplifier (refer to, e.g., Japanese Patent Application Laid-open (JP-A) No. 2004-259812).

As mentioned above, a method for quickly finding the optimal settling time is requested, and a method for quickly judging whether the settling performance has deteriorated or not is also requested. However, no sufficient methods have been established.

BRIEF SUMMARY OF THE INVENTION

One of objects according to the present invention is to provide a method for quickly inspecting and detecting the optimal settling time. Moreover, another object of the present invention to provide a method for quickly judging whether the settling performance has deteriorated or not.

In accordance with one aspect of the present invention, a method for inspecting a settling time of a deflection amplifier includes setting a settling time, performing shooting a plurality of times alternately to project two patterns of different types which are shaped by making a charged particle beam pass through a first and a second apertures while deflecting the charged particle beam by a deflector controlled by an output of a deflection amplifier which is driven based on the settling time having been set, measuring beam currents of the shooting, calculating an integral current of the beam currents measured, and calculating a difference between the integral current calculated and a reference integral current to output the difference.

In accordance with another aspect of the present invention, a method for judging a failure of a deflection amplifier includes setting a settling time, performing shooting a plurality of times alternately to project two patterns of different types which are shaped by making a charged particle beam pass through a first and a second apertures while deflecting the charged particle beam by a deflector controlled by an output of a deflection amplifier which is driven based on the settling time having been set, measuring beam currents of the shooting, calculating an integral current of the beam currents measured, calculating a first difference between the integral current calculated and a reference integral current, and judging that there is a failure in the deflection amplifier when a second difference between the first difference calculated and a reference value of the settling time exceeds a predetermined range.

DETAILED DESCRIPTION OF THE INVENTION

In the following Embodiments, a structure utilizing an electron beam as an example of a charged particle beam will be described. The charged particle beam is not limited to the electron beam. Another charged particle beam, such as an ion beam, may also be used. As an example of a charged particle beam apparatus, a variable-shaped type electron beam writing apparatus will be described.

EMBODIMENT 1

Figure 1:
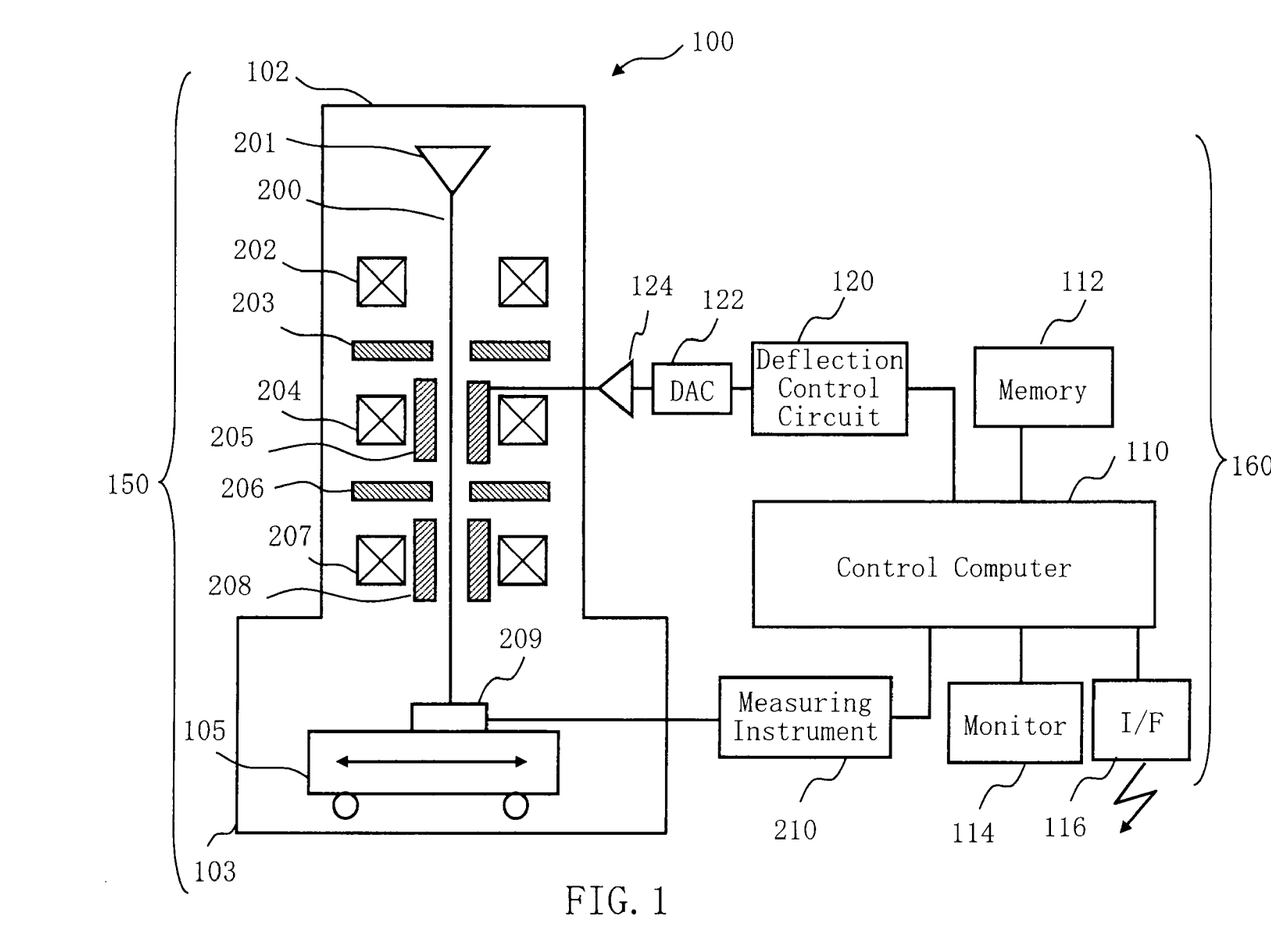
FIG. 1 is a schematic diagram showing a structure of a pattern writing apparatus according to Embodiment 1.

FIG. 1 is a schematic diagram showing the structure of a pattern writing apparatus according to Embodiment 1. In the figure, a pattern writing apparatus 100 includes a writing unit 150 and a control unit 160. The pattern writing apparatus 100 is an example of a charged particle beam pattern writing apparatus, and particularly an example of a variable-shaped type writing apparatus. The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, and a deflector 208. In the writing chamber 103, there is an XY stage 105 on which a target workpiece such as a mask (not shown herein) serving as a writing target is placed when writing. On the XY stage 105, a Faraday cup 209 is placed at a different position from that of the target workpiece. The control unit 160 includes a control computer 110, a memory 112, a monitor 114, an interface circuit 116, a deflection control circuit 120, a DAC (digital analog converter) 122, a deflection amplifier 124, and a measuring instrument 210. The memory 112, the monitor 114, the interface circuit 116, the deflection control circuit 120, and the measuring instrument 210 are connected to the control computer 110 through a bus (not shown). Moreover, the deflection control circuit 120 is connected to the deflection amplifier 124 through the DAC 122. The deflection amplifier 125 is connected to the deflector 205. The measuring instrument 210 is connected to the Faraday cup 209. Input data to be input into the control computer 110 or an operated or calculated result is stored in the memory 112. While FIG. 1 shows only the structure elements necessary for explaining Embodiment 1, it should be understood that other structure elements generally necessary for the writing apparatus 100 may also be included.

Figure 2:
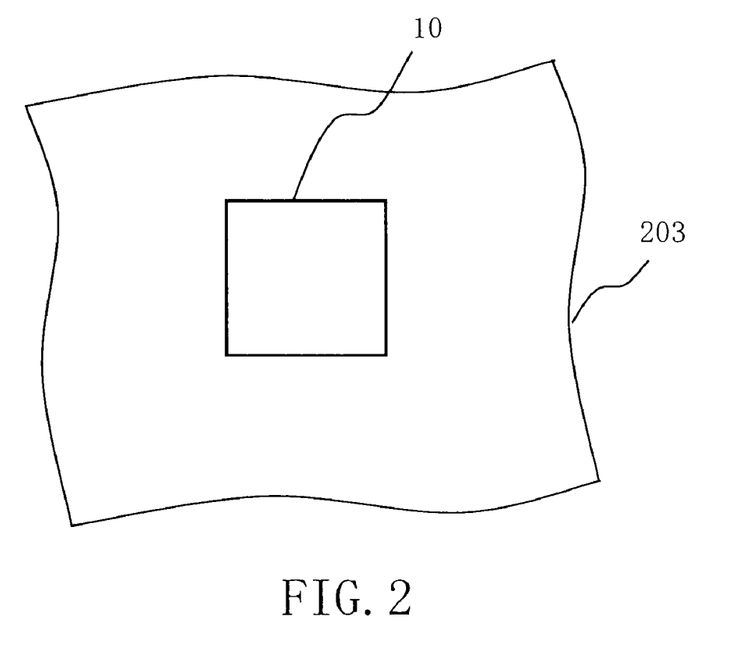
FIG. 2 is a schematic diagram showing an example of an opening of a first aperture plate according to Embodiment 1.
Figure 3:
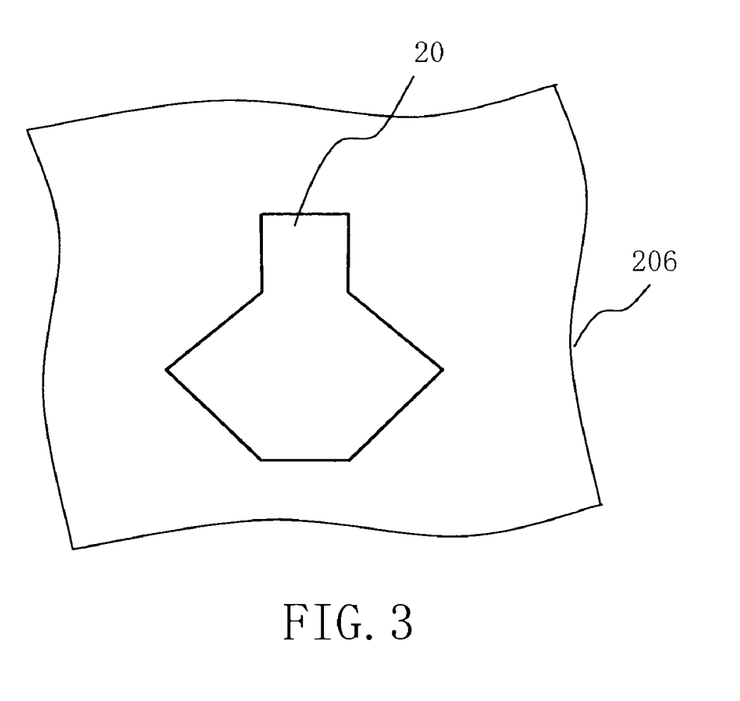
FIG. 3 is a schematic diagram showing an example of an opening of a second aperture plate according to Embodiment 1.

FIG. 2 is a schematic diagram showing an example of an opening of the first aperture plate according to Embodiment 1. FIG. 3 is a schematic diagram showing an example of an opening of the second aperture plate according to Embodiment 1. In FIG. 2, an opening portion 10 of a quadrangle, such as a square or a rectangle, is shaped in the first aperture plate 203. In FIG. 3, an opening portion 20 made by connecting one side of a rectangle and one side of a hexagon is shaped in the second aperture plate 206. The opening portion 20 is shaped to be a figure, each of whose angles of apexes is an integral multiple of 45 degrees, for example.

The writing apparatus 100 operates as follows: an electron beam 200 emitted from the electron gun assembly 201 irradiates the entire first aperture plate 203 having a quadrangular such as rectangular opening by the illumination lens 202. At this point, the electron beam 200 is shaped to be a quadrangle such as r a rectangle. Then, after having passed through the opening portion of the first aperture plate 203, the electron beam 200 of a first aperture image is projected onto the second aperture plate 206 by the projection lens 204. A digital signal indicating an amount of deflection output by the deflection control circuit 120 is converted to an analog deflection voltage at the DAC 122, and applied to the deflector 205 after being amplified by the deflection amplifier 124. The first aperture image on the second aperture plate 206 is deflection-controlled by the deflector 205 to which the deflection voltage is applied, and thereby changing the shape and size of the beam. After having passed through the opening portion of the second aperture plate 206, the electron beam 200 of a second aperture image is focused by the objective lens 207 and deflected by the deflector 208, to reach a desired position on the target workpiece placed on the XY stage 105 which is continuously moving. Although the settling time of the deflection amplifier 124 for the deflector 205 used for beam shaping can be set arbitrarily, if it is set long, the throughput is lowered by that much. Conversely, if the settling time is too short, since sufficient voltage is not applied to the deflector 205, necessary deflection is not performed. Consequently, an error may occur with respect to a dimension of a pattern to be formed. Therefore, finding the optimal settling time is needed. In Embodiment 1, a method for finding the optimal settling time without performing actual writing onto a target workpiece for inspection will be described below.

Figure 4:
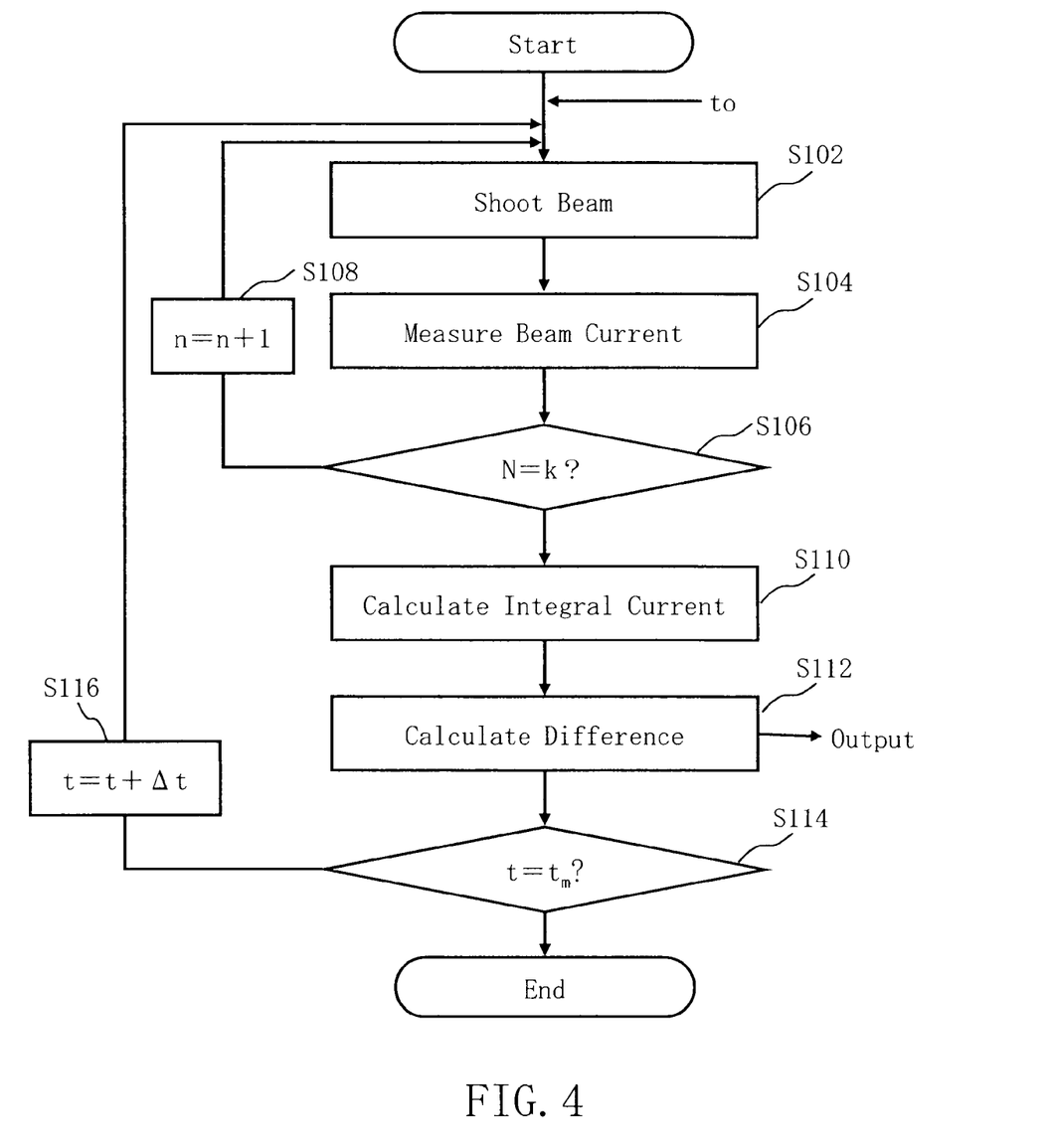
FIG. 4 is a flowchart showing main steps of a method for inspecting a settling time of a deflection amplifier according to Embodiment 1.

FIG. 4 is a flowchart showing main steps of a method for inspecting the settling time of a deflection amplifier according to Embodiment 1. In FIG. 4, the method executes a series of steps: a shooting step (S102), a beam current measuring step (S104), a number of times judging step (S106), a number of times changing step (S108), an integral current calculating step (S110), a difference calculating step (S112), a settling time judging step (S114) and a set time changing step (S116).

Figure 5:
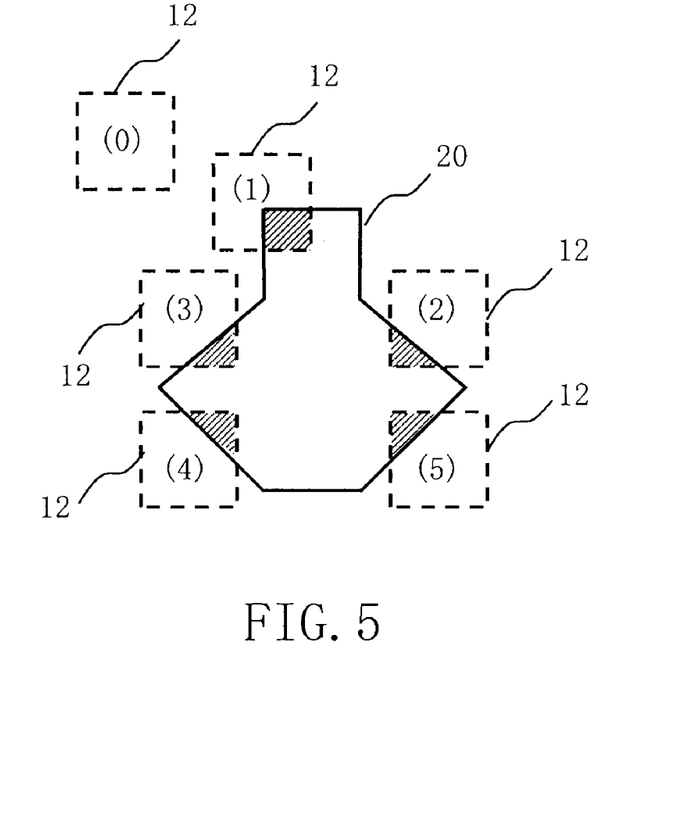
FIG. 5 shows an example of a position shaped by deflection according to Embodiment 1.

FIG. 5 shows an example of a position formed by deflection according to Embodiment 1. FIG. 5 shows an example of an overlapping position between a first shaping aperture image 12 which has passed the opening portion 10 and the opening portion 20 of the second aperture plate 206. If the electron beam 200 is not deflected by the deflector 205, the first shaping aperture image 12 is projected onto a position, denoted by (0), displaced from the opening portion 20.

For example, when shaping the electron beam 200 into a square or a rectangle, the first shaping aperture image 12 is deflected by the deflector 205, to which the deflection voltage output from the deflection amplifier 124 is applied, to be projected onto the position denoted by (1). Then, the portion shown in shadow lines in the projected image, which is to pass the opening portion 20, becomes a formed image.

Moreover, for example, when shaping the electron beam 200 into a right-angled isosceles triangle whose right angle is located at the lower left in FIG. 5, the first shaping aperture image 12 is deflected by the deflector 205, to which the deflection voltage output from the deflection amplifier 124 is applied, to be projected onto the position denoted by (2). Then, the portion shown in shadow lines in the projected image, which is to pass the opening portion 20, becomes a formed image.

Moreover, for example, when shaping the electron beam 200 into a right-angled isosceles triangle whose right angle is located at the lower right in FIG. 5, the first shaping aperture image 12 is deflected by the deflector 205, to which the deflection voltage output from the deflection amplifier 124 is applied, to be projected onto the position denoted by (3). Then, the portion shown in shadow lines in the projected image, which is to pass the opening portion 20, becomes a formed image.

Moreover, for example, when shaping the electron beam 200 into a right-angled isosceles triangle whose right angle is located at the upper right in FIG. 5, the first shaping aperture image 12 is deflected by the deflector 205, to which the deflection voltage output from the deflection amplifier 124 is applied, to be projected onto the position denoted by (4). Then, the portion shown in shadow lines in the projected image, which is to pass the opening portion 20, becomes a formed image.

Further, for example, when shaping the electron beam 200 into a right-angled isosceles triangle whose right angle is located at the upper left in FIG. 5, the first shaping aperture image 12 is deflected by the deflector 205, to which the deflection voltage output from the deflection amplifier 124 is applied, to be projected onto the position denoted by (5). Then, the portion shown in shadow lines in the projected image, which is to pass the opening portion 20, becomes a formed image.

A desired pattern is written onto the target workpiece by changing such figures at each shot. With respect to a settling time t of the deflection amplifier 124, for example, it is necessary to set a time required in order to perform deflection between two positions in the positions from (0) to (5). For example, the settling time required in order to perform deflection from the position denoted by (2) to the position denoted by (4) will be described below.

First, the settling time t of the deflection amplifier 124 is set at a settable minimum value $t_0$. The XY stage 105 is moved so that the Faraday cup 209 may be located on the optical axis of the electron beam 200. When the electron beam 200 having passed the opening portion 20 is shot onto the optical axis without being deflected by the deflector 208, deflection by the deflector 208 is not needed. If the electron beam 200 having passed the opening portion 20 deviates from the optical axis, what is necessary is to deflect the electron beam 200 having passed the opening portion 20 so that it may be shot onto the Faraday cup 209.

In step S102, as a shooting step, while deflecting the electron beam 200 by the deflector 205 controlled by an output of the deflection amplifier 124 which is driven based on the settling time t having been set, shooting is performed a plurality of times alternately to project two patterns of different types shaped by making the electron beam 200 pass both the first aperture plate 203 and the second aperture plate 206.

Figure 6:
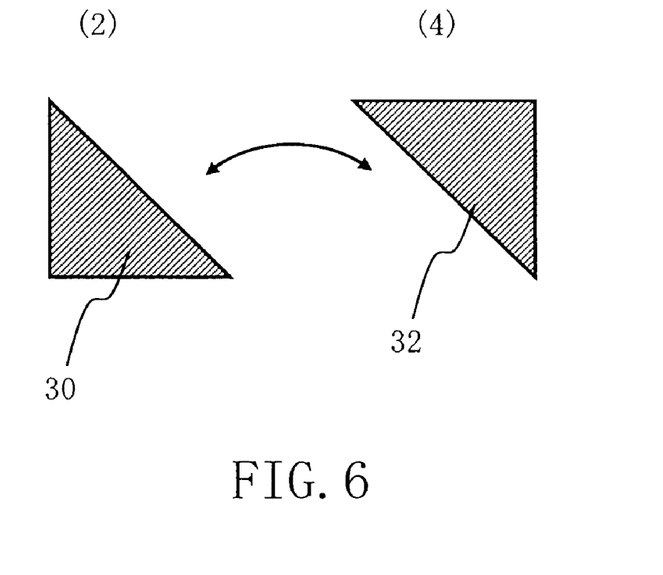
FIG. 6 shows an example of figures which are projected alternately according to Embodiment 1.

FIG. 6 shows an example of figures which are projected alternately according to Embodiment 1. FIG. 6 shows the case, as an example, where a pattern 30 of a right-angled isosceles triangle, whose right angle is located at the lower left, fabricated by projecting the first shaping aperture image 12 onto the position denoted by (2), and a pattern 32 of a right-angled isosceles triangle, whose right angle is located at the upper right, fabricated by projecting the first shaping aperture image 12 onto the position denoted by (4) are formed alternately. When performing shooting a plurality of times to project such two patterns of different types, the electron beam 200 is made to pass through the same positions of the first aperture plate 203 and the second aperture plate 206 each time.

In step S104, as a beam current measuring step, the beam current of the electron beam 200 irradiating the Faraday cup 209 is measured at each shot. A beam current value of the electron beam 200 irradiating the Faraday cup 209 is measured by the measuring instrument 210, and output, as a digital signal, to the control computer 110.

In step S106, as a number of times judging step, the control computer 110 counts the number of times n of shooting, and judges whether the number of times n is equal to a predetermined number of times k or not. For example, it is preferable to set to perform shooting several tens of thousands of times for each pattern.

In step S108, as a number of times changing step, when the number of times n of shooting has not reached the predetermined number of times k, the control computer 110 adds 1 to n, and it returns to S102.

As mentioned above, the steps from S102 to S108 are repeated a plurality of times while performing shooting in order that the patterns 30 and 32 may be formed alternately. For example, even when performing shooting several tens of thousands times for each pattern by using the pattern writing apparatus 100, such shooting can be finished in about one second.

In step S110, as an integral current calculating step, the control computer 110 integrates beam currents which are measured when performing shooting a plurality of times in order to alternately form the patterns 30 and 32, to thereby calculate an integral current.

In step S112, as a difference calculating step, the control computer 110 calculates a difference between the calculated integral current and a reference integral current, which will be hereinafter referred to as an integral current difference. Then, a calculation result is output to be stored in the memory 112. Alternatively, the calculation result may be output outside through the I/F circuit 116. The reference integral current can be obtained by integrating beam currents measured when performing shooting a predetermined times continuously to shape the pattern 30 and when performing shooting a predetermined times continuously to shape the pattern 32 under the state where the same the settling time is set for them. This reference integral current may be measured and calculated in advance. Alternatively, it is also preferable to perform in parallel the case of shooting a beam to alternately shape the patterns 30 and 32, which is corresponding to the steps from S102 to S110, and the case of shooting a beam to continuously shape the pattern 30 and then doing the same to continuously shape the pattern 32, which is corresponding to the steps to obtain the reference integral current. The integral current obtained by performing shooting to continuously shape the pattern 32 and then doing the same to continuously shape the pattern 30 can be regarded as the reference integral current.

In step S114, as a settling time judging step, the control computer 110 judges whether the settling time t that has been set is equal to a predetermined maximum time tm or the settling time t has exceeded the maximum time tm. When the settling time t has not reached the maximum time tm, $\Delta t$ is added to the settling time t, and it returns to step S102. If the settling time t has reached the maximum time tm, it ends.

As mentioned above, the steps from S102 to S116 are repeated while gradually making the settling time t large. When a difference between the integral current and the reference integral current is large, it is judged that the settling time is not the optimal value. Therefore, performing each step while changing the settling time, what is necessary is to find the settling time based on which the difference becomes smaller. Owing to this method, for example, it is possible to obtain a relation between the settling time t and the integral current difference in the case of performing deflection from the position denoted by (2) to the position denoted by (4) in FIG. 5.

Figure 7:
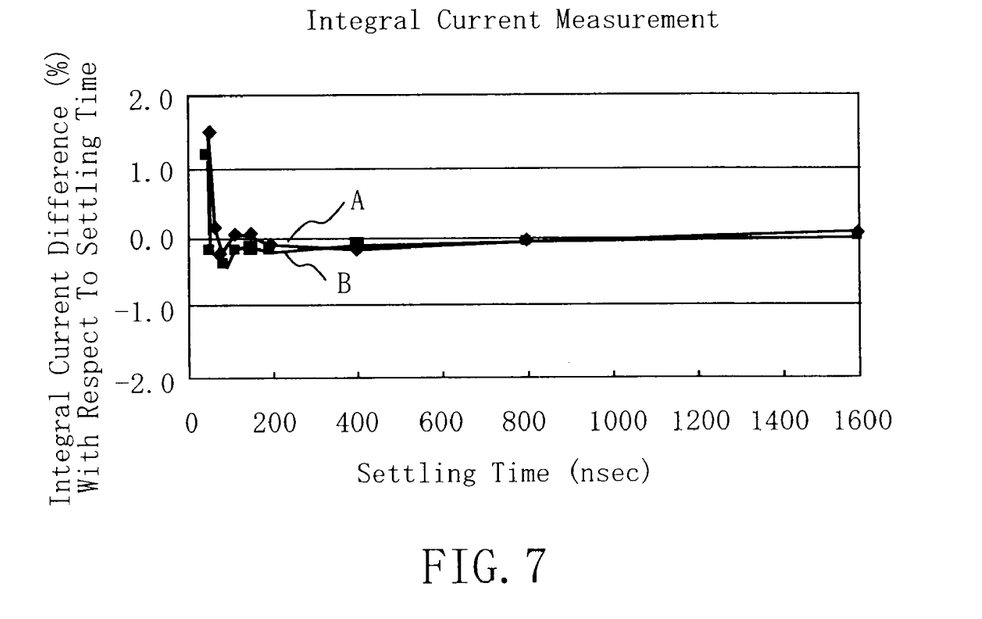
FIG. 7 shows an example of a relation between a settling time t and an integral current difference according to Embodiment 1.

FIG. 7 shows an example of a relation between the settling time t and an integral current difference according to Embodiment 1. In the figure, the line graph denoted by "A" shows a relation between the settling time t and the integral current difference in the case of performing deflection from the position denoted by (2) to the position denoted by (4). The line graph denoted by "B" shows a relation between the settling time t and the integral current difference in the case of performing deflection from the position denoted by (3) to the position denoted by (5). Since the number of patterns formed is consequently the same in both the cases of shooting a beam to continuously shape one pattern and then doing the same to continuously shape the other pattern, and of shooting a beam to alternately shape the patterns, values of integral current in both the cases should also be the same if the settling time is enough. Therefore, the settling time based on which the integral current difference is substantially 0 should be regarded as the optimal time. It is difficult to judge the settling time by measuring only one beam current because the current value is too small. However, by using an integral current obtained by integrating beam currents which are shot a plurality of times, the current value can be made large, thereby making the difference clear to be judged. According to FIG. 7, it can be known from the graph A that the optimal settling time when performing deflection from the position denoted by (2) to the position denoted by (4) in FIG. 5 is approximately 200 nsec. Moreover, it can be known from the graph B that the optimal settling time when performing deflection from the position denoted by (3) to the position denoted by (5) in FIG. 5 is approximately 150 nsec. The graph is created by the control computer 110 to be displayed on the monitor 114 to be viewed by a user. Alternatively, it may be output outside through the I/F circuit 116.

Figure 8:
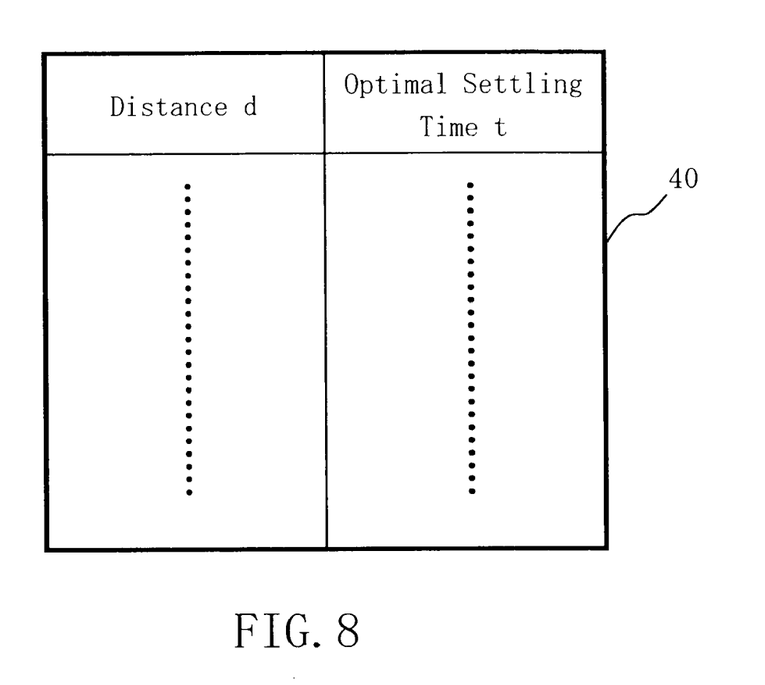
FIG. 8 shows a relation between a deflection distance d and the optimal settling time t according to Embodiment 1.

FIG. 8 shows a relation between a deflection distance d and the optimal settling time t according to Embodiment 1. Although the case of performing deflection from the position denoted by (2) to the position denoted by (4) in FIG. 5 is described in the example mentioned above, measurement is also similarly performed between other two positions to create a correlation table 40 showing a relation between the deflection distance d and the optimal settling time t. Approximately 30 to 60 minutes is needed for creating the correlation table 40. By referring to the correlation table 40, the optimal settling time t can be known from the distance d which is necessary for deflection for forming.

As described above, according to Embodiment 1, since the optimal settling time can be judged based on a difference between a beam integral current and a reference integral current, it is not necessary to actually write a pattern onto the substrate. Therefore, the time for preparing a substrate with resist applied becomes unnecessary though such time has been conventionally needed. Moreover, time for developing, time for etching, and time for actually measuring the dimension of a pattern formed become unnecessary. Therefore, compared with the conventional case, time for inspecting the optimal settling time of a shaping amplifier can be greatly reduced, thereby quickly finding the optimal settling time.

EMBODIMET 2

In Embodiment 1, there has been described a method for inspecting the optimal settling time of a forming amplifier. In Embodiment 2, there will be described a method for judging a failure of a deflection amplifier by using a relation between the settling time t and the integral current difference mentioned above.

Figure 9:
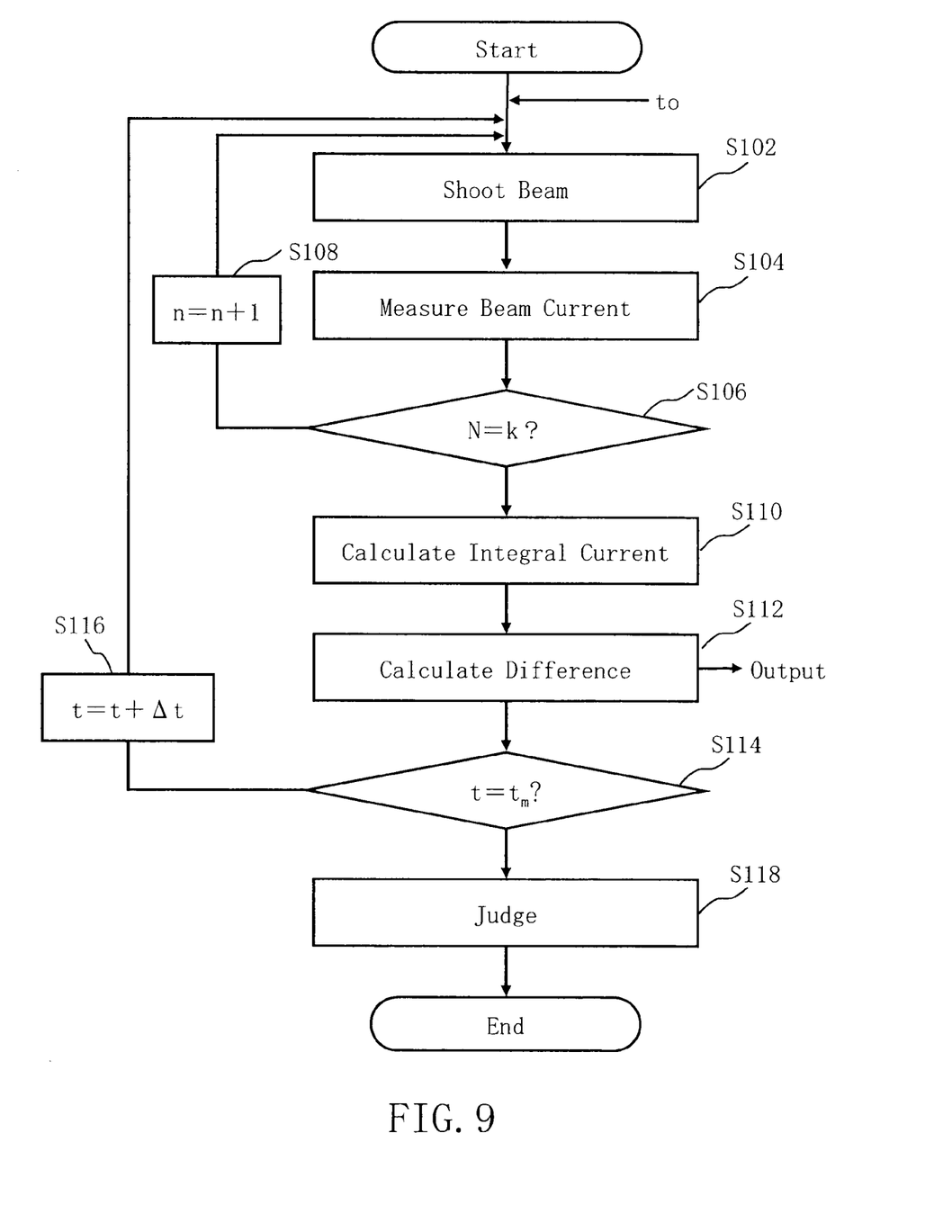
FIG. 9 is a flowchart showing main steps of a method for judging a failure of a deflection amplifier according to Embodiment 2.

FIG. 9 is a flowchart showing main steps of a method for judging a failure of a deflection amplifier according to Embodiment 2. FIG. 9 is the same as FIG. 4 except for the addition of a judging step (S118) after the settling time judging step (S114). Moreover, the structure of the apparatus is also the same as that of FIG. 1. When an error occurs in a pattern dimension, whether the error is caused by a failure of the deflection amplifier 124 or not is judged as follows:

A reference value of each settling time is beforehand calculated by using a shaping amplifier which is not out of order. Then, each step from S102 to S114 is performed similarly to Embodiment 1 by using the deflection amplifier 124 having a probability of being in a failure state. By this, it is possible to obtain a relation between the settling time t and an integral current difference in the case of using the deflection amplifier 124 having a probability of being in a failure state.

Figure 10:
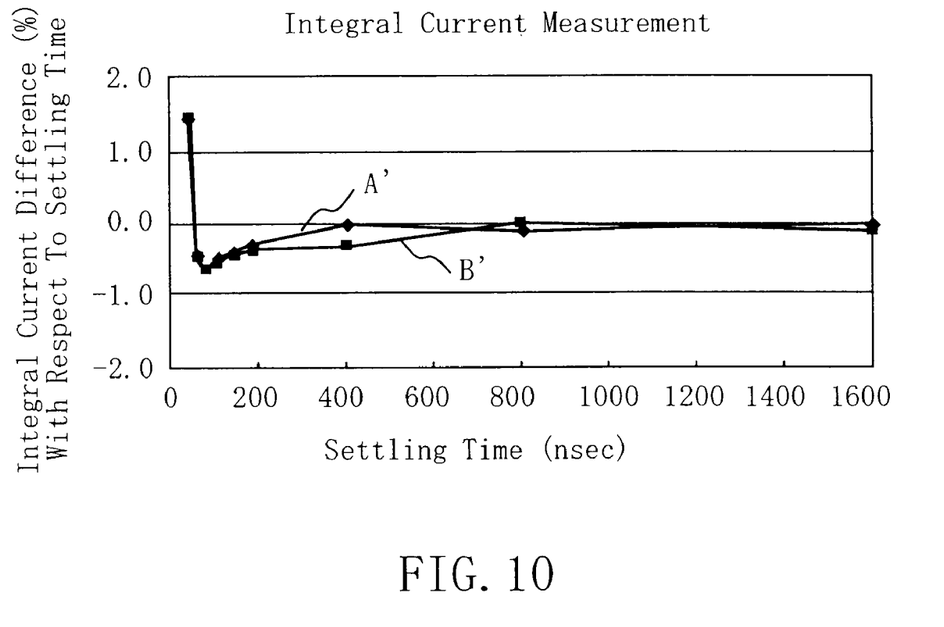
FIG. 10 shows an example of a relation between a settling time t and an integral current difference according to Embodiment 2.

FIG. 10 shows an example of a relation between the settling time t and an integral current difference according to Embodiment 2. In the figure, the line graphs denoted by "A'" and "B'" show examples of a relation between the settling time t and an integral current difference obtained by using the deflection amplifier 124 having a probability of being in a failure state. It should be understood that the comparing is performed using results of forming the same pattern.

In step S118, as a judging step, when a difference (second difference) between a calculated difference (first difference), which is the integral current difference between a calculated integral current and a reference integral current calculated at the step S112, and a reference value of the settling time exceeds a predetermined range, it is judged that there is a failure in the deflection amplifier 124. This judgment may be performed by the control computer 110 or the user. As shown in FIG. 7, according to the evaluation of Embodiment 1, the integral current difference of the line graph A is substantially 0 at around 200 nsec. On the other hand, in the example of FIG. 10, the integral current difference of A' and the integral current difference of B' are greatly away from 0 at the period of the settling time t from 100 nsec to 400 nsec. Therefore, when such a result is obtained, it can be judged that the deflection amplifier 124 having a probability of being in a failure state is actually out of order. The range of a reference used for judging a failure may be set arbitrarily and suitably. For example, herein, one graph obtained by measuring only the case of deflection from the position denoted by (2) to the position denoted by (4) in FIG. 5 enables to judge the existence of a failure. Thus, the result can be obtained in several seconds or several minutes.

As mentioned above, if a relation between the settling time t and the integral current difference in the case of using a shaping amplifier not being in a failure state can be known in advance, it is possible to obtain a difference between an integral current difference in the case of using a shaping amplifier having a probability of being in a failure state and a reference value of the settling time mentioned above. Then, when the difference exceeds a predetermined range, it is judged that there is a failure in the deflection amplifier. In other words, a failure of the shaping amplifier can be quickly judged by comparing a calculated integral current difference and the reference value of the settling time. Therefore, the down time period of the apparatus can be reduced.

Figure 11A:
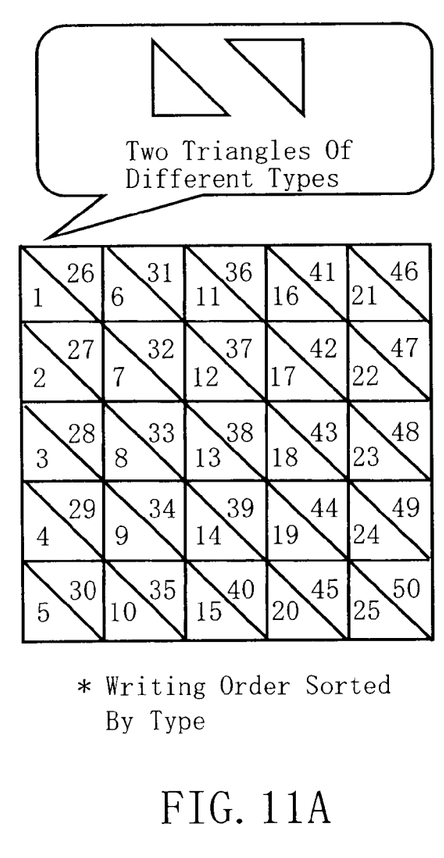
FIGS. 11A and 11B show examples of an irradiation position in the case of performing shooting while changing the irradiation position.
Figure 11B:
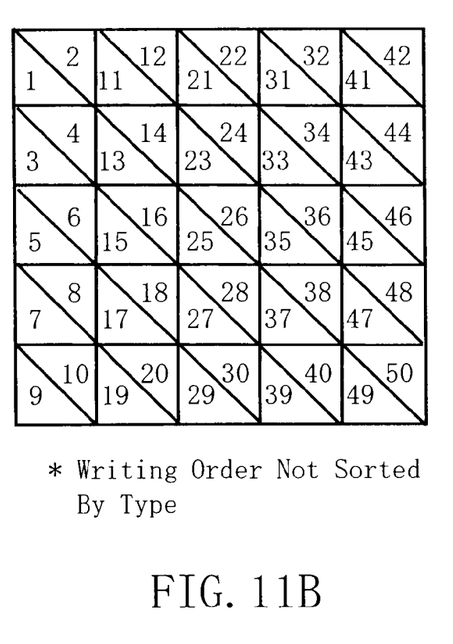

In each Embodiment mentioned above, when two patterns of different types are projected onto the Faraday cup 209, the irradiation position is not changed, however, it is not limited thereto. FIGS. 11A and 11B show examples of the irradiation position in the case of performing shooting while changing the irradiation position. FIG. 11A shows the case of continuously projecting one figure from the number 1 to the number 25, and then continuously projecting the other figure from the number 26 to the number 50. FIG. 11B shows the case of alternately projecting the two figures from the number 1 to the number 50. In FIGS. 11A and 11B, the number indicates a shooting order. What is necessary in both the cases of FIGS. 11A and 11B is to deflect the electron beam 200 by the deflector 208 so that the Faraday cup 209 may receive the electron beam 200. In this case, although shooting is performed 25 times respectively, namely totally 50 times, as an example, it is preferable to perform shooting several tens of thousands times respectively, for example.

Figure 12:
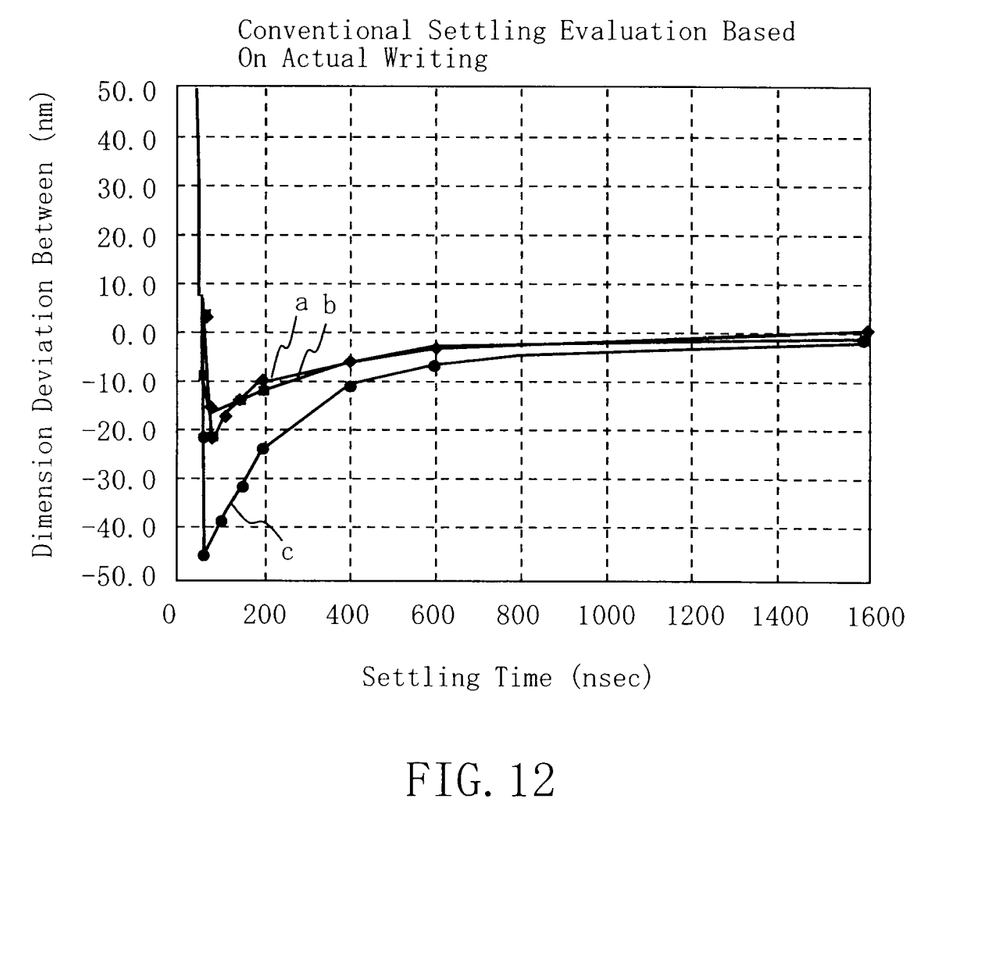
FIG. 12 shows a relation between a dimension deviation and a settling time in the case of evaluating a settling time by a conventional method to be compared with Embodiment 2.

FIG. 12 shows a relation between a dimension deviation and a settling time in the case of evaluating the settling time by the conventional method to be compared with Embodiment 2. In this case, two patterns of different types are actually written onto a substrate with resist applied. For example, the two patterns of different types as shown in FIG. 11B may be alternately written onto the substrate. Then, the dimension of a pattern which has been formed by developing and etching the written substrate is measured. These operations are performed repeatedly while changing the settling time. A deviation between a pattern dimension obtained based on each settling time and a pattern dimension obtained based on the settling time which is set to be sufficiently long is shown in the graph. In FIG. 12, the line graphs denoted by "a", "b" and "c" show the cases in which structures of written patterns are different. Shown herein are results of using a shaping amplifier having a probability of being in a failure state. It can be known from the graph shown in FIG. 12 that the dimension deviation of each graph is large at between 100 nsec and 400 nsec. Results of the method according to Embodiment 2, using a shaping amplifier having a probability of being in a failure state, also show that the integral current difference is greatly away from 0 at between 100 nsec and 400 nsec. Thus, the same result as that of the conventional evaluation has been obtained. Therefore, the method of Embodiment 2 is sufficiently effective in judging a failure of a shaping amplifier.

As mentioned above, according to Embodiment 2, it is possible to quickly judge whether the settling performance has deteriorated or not.

While the embodiments have been described above with reference to specific examples, the present invention is not limited to these specific ones.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other method for inspecting a settling time of a deflection amplifier and method for judging a failure of a deflection amplifier that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for inspecting a settling time of a deflection amplifier, the method comprising:
   setting a settling time;
   performing shooting a plurality of times alternately to project two patterns of different types which are shaped by making a charged particle beam pass through a first and a second apertures while deflecting the charged particle beam by a deflector controlled by an output of a deflection amplifier which is driven based on the settling time having been set;
   measuring beam currents of the shooting;
   calculating an integral current of the beam currents measured; and
   calculating a difference between the integral current calculated and a reference integral current to output the difference.

2. The method according to claim 1, wherein the performing shooting, the measuring the beam currents, the calculating the integral current, and the calculating the difference are performed while changing the settling time.

3. The method according to claim 2, wherein the settling time is made to be large gradually.

4. The method according to claim 3, wherein when performing the shooting the plurality of times, the charged particle beam is made to pass through same positions of the first and the second apertures respectively each time.

5. The method according to claim 1, wherein the beam currents are measured by using a Faraday cup.

6. The method according to claim 1, wherein the reference integral current is calculated by integrating beam currents obtained when performing shooting a plurality of times continuously to project the two patterns of different types respectively.

7. A method for judging a failure of a deflection amplifier, the method comprising:
    setting a settling time;
    performing shooting a plurality of times alternately to project two patterns of different types which are shaped by making a charged particle beam pass through a first and a second apertures while deflecting the charged particle beam by a deflector controlled by an output of a deflection amplifier which is driven based on the settling time having been set;
    measuring beam currents of the shooting;
    calculating an integral current of the beam currents measured;
    calculating a first difference between the integral current calculated and a reference integral current; and
    judging that there is a failure in the deflection amplifier when a second difference between the first difference calculated and a reference value of the settling time exceeds a predetermined range.

8. The method according to claim 7, wherein the beam currents are measured by using a Faraday cup.

9. The method according to claim 7, wherein the performing shooting, the measuring the beam current, the calculating the integral current, the calculating the difference, and the judging are performed while changing the settling time.

10. The method according to claim 7, wherein the reference integral current is calculated by integrating beam currents obtained when performing shooting a plurality of times continuously to project the two patterns of different types respectively.

* * * * *